US011462468B2

(12) United States Patent
Cheah et al.

(10) Patent No.: US 11,462,468 B2
(45) Date of Patent: Oct. 4, 2022

(54) SEMICONDUCTOR PACKAGE, SEMICONDUCTOR SYSTEM, AND METHOD OF FORMING SEMICONDUCTOR PACKAGE

(71) Applicant: Intel Corporation, Santa Clara, CA (US)

(72) Inventors: Bok Eng Cheah, Gelugor Pulau Pinang (MY); Jackson Chung Peng Kong, Tanjung Tokong Pulau Pinang (MY)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 16/987,409

(22) Filed: Aug. 7, 2020

(65) Prior Publication Data

US 2021/0384116 A1    Dec. 9, 2021

(30) Foreign Application Priority Data

Jun. 5, 2020    (MY) .............................. PI2020002904

(51) Int. Cl.
*H01L 23/50*     (2006.01)
*H01L 23/367*    (2006.01)
*H01R 12/75*     (2011.01)
*H01L 25/00*     (2006.01)
*H01L 25/10*     (2006.01)

(52) U.S. Cl.
CPC .......... *H01L 23/50* (2013.01); *H01L 23/3675* (2013.01); *H01L 25/105* (2013.01); *H01L 25/50* (2013.01); *H01R 12/75* (2013.01)

(58) Field of Classification Search
CPC .... H01L 23/36; H01L 23/367; H01L 23/3675; H01L 23/50; H01L 25/10; H01L 25/105; H01L 25/50; H01R 12/75
USPC ........................................................ 257/693
See application file for complete search history.

(56) References Cited

U.S. PATENT DOCUMENTS

| | | | | |
|---|---|---|---|---|
| 6,282,095 B1 * | 8/2001 | Houghton | ........... | H01L 23/3675 165/80.2 |
| 2015/0228553 A1 * | 8/2015 | Saeidi | .................... | H01L 23/16 257/712 |

* cited by examiner

*Primary Examiner* — Monica D Harrison
(74) *Attorney, Agent, or Firm* — Viering, Jentschura & Partner MBB

(57) ABSTRACT

A semiconductor package may include a semiconductor device coupled to a package substrate. The semiconductor package may also include an integrated heat spreader coupled to the package substrate. The semiconductor package may further include a package connector mounted on the integrated heat spreader. According to various examples, a semiconductor system is also described. The semiconductor system may include a first semiconductor package. The first semiconductor package may include a first package connector, and a first integrated heat spreader. The first package connector may be mounted on the first integrated heat spreader. The semiconductor system may also include a second semiconductor package. The second semiconductor package may include a second package connector, and a second integrated heat spreader. The second package connector may be mounted on the second integrated heat spreader. The first package connector may be electrically connected to the second package connector.

18 Claims, 4 Drawing Sheets

SEMICONDUCTOR PACKAGE, SEMICONDUCTOR SYSTEM, AND METHOD OF FORMING SEMICONDUCTOR PACKAGE

CROSS-REFERENCE TO RELATED APPLICATIONS

This application claims priority to Malaysian Patent Application PI2020002904, which was filed on Jun. 5, 2020, the entire contents of which are hereby incorporated herein by reference.

BACKGROUND

With conventional interconnect designs (e.g., through package and printed circuit board (PCB) interconnects), scaling performance of high-speed input/output (IO) interfaces faces signal integrity (SI) limitations beyond a signal frequency of 40 GHz. The next-generation IO interfaces, e.g., 224 G serializer/deserializer (SERDES) Ethernet, 40 G Thunderbolt (TBT), and 32 G peripheral component interconnect express (PCIe) Gen5, have signals propagating through package to motherboard interconnects e.g., a solder ball, a PCB transmission line, one or more electronic components e.g., a retimer, a redriver, a multiplexer or a connector mounted on the PCB for server, mobile and/or desktop applications. Due to the resistance and capacitance (RC) parasitic effects of such interconnects, there are huge electrical impairments, in terms of attenuation losses and multi-reflection noises, that may not allow the scaling of the performance of high-speed IO interfaces in next-generation IO interfaces at a signal frequency of more than 40 GHz.

The existing on-package connector solutions to address the electrical impairments associated to the conventional package to PCB interconnect designs involve seating the connector and/or associated components, e.g., mechanical holders like retention mounting clips, or alignment holes to secure the connector for interconnection. The additional package substrate real estate required for the connector, associated connector components (e.g., mounting pads, retention mounting clips, and mechanical holders), and alignment holes inhibit package miniaturizations, and/or connector interconnect density scaling.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the present disclosure. The dimensions of the various features or elements may be arbitrarily expanded or reduced for clarity. In the following description, various aspects of the present disclosure are described with reference to the following drawings, in which.

DETAILED DESCRIPTION

Figure 1:
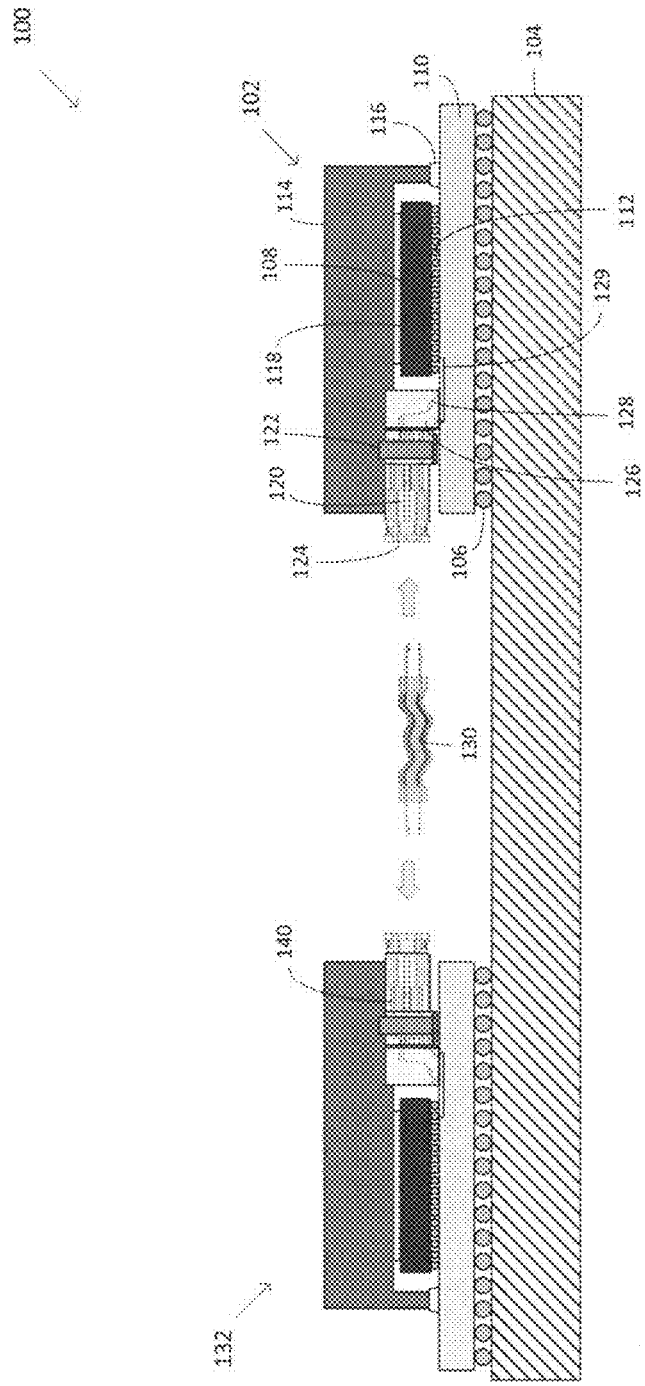
FIG. 1 shows a cross-sectional view of a semiconductor system with a package connector mounted on an integrated heat spreader according to an aspect of the present disclosure.

The following detailed description refers to the accompanying drawings that show, by way of illustration, specific details and aspects in which the present disclosure may be practiced. These aspects are described in sufficient detail to enable those skilled in the art to practice the present disclosure. Various aspects are provided for systems, various aspects are provided for packages, and various aspects are provided for methods. It will be understood that the basic properties of the systems and/or packages also hold for the methods and vice versa. Other aspects may be utilized and structural, and logical changes may be made without departing from the scope of the present disclosure. The various aspects are not necessarily mutually exclusive, as some aspects can be combined with one or more other aspects to form new aspects.

An advantage of the present disclosure may include improved signal integrity performance for high-speed signaling for next-generation multi-gigabits per second (Gbps) SERDES, TBT, and PCIe signals. Improved signal integrity performance may be achieved by circumventing electrical loss (lossy) and/or reflective package to motherboard vertical interconnects, e.g., ball grid array (BGA), and plated through-hole (PTH). This may allow device bandwidth scaling and/or more power-efficient circuitry design.

Another advantage of the present disclosure may include package miniaturization through reduced package form-factor by the elimination of contact pads, and associated package keep-out-zone required to house the retention mounting clips and/or mechanical holders, and reduction of platform components, e.g., a voltage regulator, a re-timer or re-driver component, that are required to amplify the transmitted high-speed signals.

Another advantage of the present disclosure may include improved radiofrequency interference (RFI) or electromagnetic interference (EMI) performance through the reduction of energy or radiation coupling from high-speed signal to sensitive interfaces, e.g., a reference clock signal or wireless signals across package, and motherboard interconnects.

The present disclosure generally relates to a device. The device may include a semiconductor device coupled to a package substrate. The device may also include an integrated heat spreader coupled to the package substrate. The device may further include a package connector mounted on the integrated heat spreader.

The present disclosure generally relates to a system. The may include a first semiconductor package. The first semiconductor package may include a first package connector, and a first integrated heat spreader. The first package connector may be mounted on the first integrated heat spreader. The system may also include a second semiconductor package. The second semiconductor package may include a second package connector, and a second integrated heat spreader. The second package connector may be mounted on the second integrated heat spreader. The first package connector may be electrically connected to the second package connector.

The present disclosure generally relates to a method. The method may include forming a package substrate. The method may also include forming a semiconductor device, and coupling the semiconductor device on the package substrate. Further, the method may include forming an integrated heat spreader. The method may also include forming a package connector, and mounting the package connector on the integrated heat spreader. In addition, the method may include mounting the integrated heat spreader with the package connector over the semiconductor device on the package substrate. The package connector may have a first side configured for electrical connection to a second package connector of a second semiconductor package, and may have a second side configured for electrical connection to the semiconductor device.

To more readily understand and put into practical effect, the present semiconductor packages, system, method, and other particular aspects will now be described by way of examples and not limitations, and with reference to the figures. For the sake of brevity, duplicate descriptions of features and properties may be omitted.

FIG. 1 shows a cross-sectional view of a semiconductor system with a package connector mounted on an integrated heat spreader according to an aspect of the present disclosure.

In the aspect shown in FIG. 1, the semiconductor system 100 may include a semiconductor package 102. The semiconductor system 100 may also include a motherboard 104, which may be a printed circuit board (PCB). The semiconductor package 102 may include a semiconductor device 108. The semiconductor device 108 may be a semiconductor die, chip or a set of chiplets, e.g., a central processing unit (CPU), a graphic processing unit (GPU), a group of silicon chiplets including a memory device, a platform controller hub (PCH), a sensor or an I/O tiles, e.g., a SERDES Ethernet I/O tile.

In an aspect, the semiconductor device 108 may be made from any suitable semiconductor, such as, silicon or gallium arsenide. The semiconductor package 102 may also include a package substrate 110. The semiconductor device 108 may be connected to the package substrate 110 through solder bumps 112. The solder bumps 112 may also provide an electrical connection between the semiconductor device 108 and the package substrate 110. The package substrate 110 may be connected to the motherboard 104 through solder balls 106. The solder balls 106 may also provide an electrical connection between the package substrate 110 and the motherboard 104.

In an aspect of the present disclosure, the semiconductor package 102 may include an integrated heat spreader 114. The integrated heat spreader 114 may transfer heat from a hotter source to a colder heat sink. The integrated heat spreader 114 may be connected to the package substrate 110 through adhesive layer 116. The adhesive layer 116 may also provide an electrical connection between the integrated heat spreader 114 and the package substrate 110. In an aspect, the semiconductor package 102 may include a thermal interface layer 118. The thermal interface layer 118 may be disposed between the semiconductor device 108 and the integrated heat spreader 114. The thermal interface layer 118 may be a plate or block of a material having high thermal conductivity, such as copper, aluminum, or nano-silicon carbide paste.

The thermal interface layer 118 may transfer heat from the semiconductor device 108 to the integrated heat spreader 114.

In an aspect of the present disclosure, the semiconductor package 102 may include a package connector 120. The package connector 120 may be arranged to be mounted on the integrated heat spreader 114. The package connector 120 may be mounted to the integrated heat spreader 114 using any suitable connection means, such as through one or more mechanical fasteners, e.g., mounting screws 122. In an aspect, the integrated heat spreader 114 may have a recess in an inner surface of the integrated heat spreader 114, in a portion of the integrated heat spreader 114 positioned to cover the package connector 120. The package connector 120 may be arranged to be mounted on the recessed inner surface of the integrated heat spreader 114. In an aspect, a first portion of the integrated heat spreader 114 positioned to cover the semiconductor device 108 may be thicker than a second portion of the integrated heat spreader 114 positioned to cover the package connector 120 due to the recess. In an aspect, the package connector 120 may be thicker than the semiconductor device 108. A thickness of the package connector 120 may range from approximately 500 micrometer (μm) to 3 millimeter (mm). A thickness of the semiconductor device 108 may range from approximately 100 μm to 700 μm. The recess in the second portion of the integrated heat spreader 114 positioned to cover the package connector 120 may result in additional space in the second portion of the integrated heat spreader 114, which may allow the package connector 120 to fit between the integrated heat spreader 114, and the package substrate 110. In another aspect, the package connector 120 may be mounted on a side surface of the integrated heat spreader 114. The depth of the recess may be chosen based on the difference between the size of the semiconductor device 108, and the size of the package connector 120. The depth of the recess may range from approximately 400 μm to 2 mm.

In an aspect of the present disclosure, the package connector 120 may have a first side 124 which may be configured for electrical connection to a second package connector 140 of a second semiconductor package 132. The package connector 120 may have a receptacle, e.g., a Type-C USB3 receptacle or a plug, e.g., a Type-C USB3 plug for electrical connection to another receptacle or another plug of the second package connector 140. In an aspect, the first package connector 120, and the second package connector 140 may be a receptacle-plug pair. In other words, if the first package connector 120 is a receptacle, the second package connector 140 is a plug, and if the first package connector 120 is a plug, the second package connector 140 is a receptacle.

In an aspect, an electrical connection between the package connector 120 and the second package connector 140 may be established when a plug of the second package connector 140 is inserted into a receptacle of the package connector 120. Alternatively, an electrical connection between the package connector 120 and the second package connector 140 may be established when a plug of the package connector 120 is inserted into a receptacle of the second package connector 140. In another aspect, the package connector 120 and the second package connector 140 may have either receptacles or plugs, and a cable 130 may be used to electrically connect the package connector 120 and the second package connector 140. The cable 130 may be a flexible printed circuit, a flat flexible cable, or a twin-axial cable.

In an aspect of the present disclosure, the package connector 120 may have a second side 126 which may be configured for electrical connection to the semiconductor device 108. The package connector may include connection pins 128 on the second side 126 of the package connector 120 for electrical connection to the semiconductor device 108. The connection pins 128 may be coupled to the package substrate 110. The package substrate 110 may have a package routing 129 for electrically connecting the package connector 120 to the semiconductor device 108.

In an aspect of the present disclosure, the semiconductor system 100 may include the second semiconductor package 132 with the second package connector 140.

For the sake of brevity, duplicate descriptions of features and properties are omitted. It will be understood that any features and property described herein for the semiconductor package 102 may apply to the second semiconductor package 132.

In an aspect of the present disclosure, due to the resistance and capacitance (RC) parasitic of the package connector 120, and the second package connector 140, there may be electrical performance differences, in terms of attenuation loss compared to the conventional interconnects at a signal frequency of more than 40 GHz.

Table 1 shows the electrical performance of an exemplary conventional interconnect design (e.g., through package and PCB interconnects) and an exemplary package connector on the integrated heat spreader according to aspects of the present disclosure, operating at 56 GHz.

TABLE 1

| | Frequency = 56 GHz | |
|---|---|---|
| | Conventional interconnect | Package connector on the integrated heat spreader |
| Package Loss (per pair) | −5 dB | −3 dB |
| PCB Loss (e.g., 5 inches) | −18 dB | N/A |
| Connector Loss (per pair) | N/A | −3 dB |
| Cable Loss (e.g., 5 inches) | N/A | −2 dB |
| Channel Loss (End-to-End) | ~−23 dB | −8 dB |

Due to the improved electrical performance, scaling performance of high-speed IO interfaces at signal frequencies of more than 40 GHz may be achieved.

In an aspect of the present disclosure, since the package connector 120 may be mounted on either the recessed inner surface or the side surface of the integrated heat spreader 114, components such as mounting pads, retention mounting clips (mechanical holders) or alignment holes to secure a package connector to a package substrate may not be required. Therefore, less package substrate real estate is taken up, which may result in package miniaturizations and/or connector interconnect density scaling.

Figure 2:
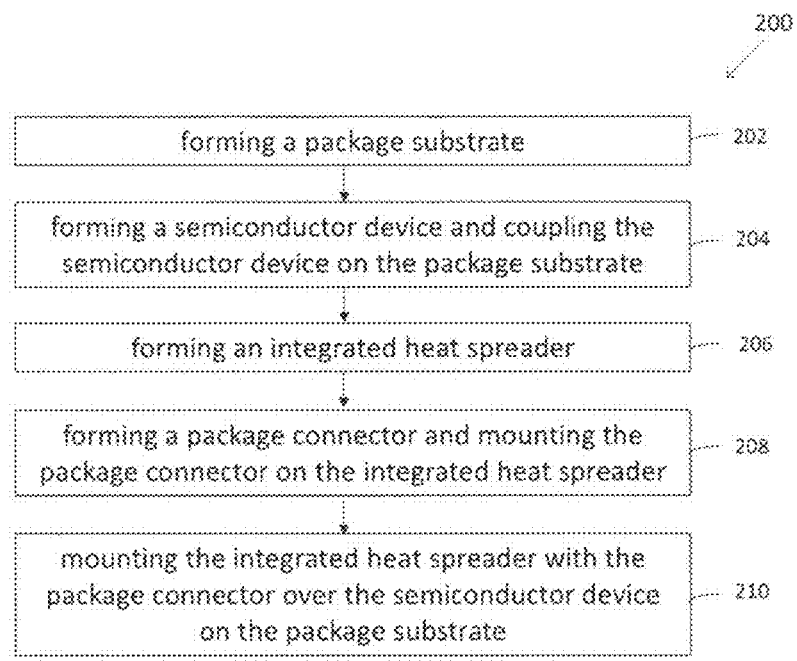
FIG. 2 shows a flow chart illustrating a method of forming a semiconductor package with a package connector mounted on an integrated heat spreader according to an aspect of the present disclosure.

FIG. 2 shows a flow chart illustrating a method of forming a semiconductor package with a package connector mounted on an integrated heat spreader according to an aspect of the present disclosure.

As shown in FIG. 2, a first operation 202 of the method 200 of forming a semiconductor package may include forming a package substrate 110. In a second operation 204, a semiconductor device 108 may be formed and may be coupled on the package substrate 110. In a third operation 206, an integrated heat spreader 114 may be formed. In a fourth operation 208, a package connector 120 may be formed, and may be mounted on the integrated heat spreader 114. The package connector 120 may have a first side that may be configured for electrical connection to a second package connector of a second semiconductor package, and may have a second side which may be configured for electrical connection to the semiconductor device 108. In a fifth operation 210, the integrated heat spreader 114 with the package connector 120 may be mounted over the semiconductor device 108 on the package substrate 110.

It will be understood that the above operations described above relating to FIG. 2 are not limited to this particular order. Any suitable, modified order of operations may be used.

Figure 3:
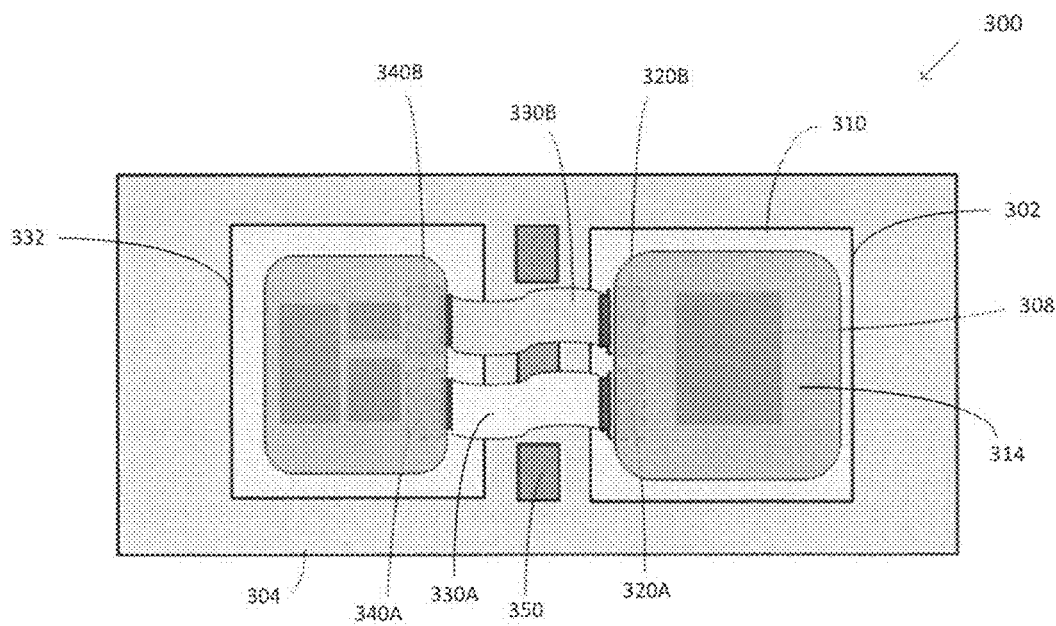
FIG. 3 shows a top view of a semiconductor system according to an aspect of the present disclosure.

FIG. 3 shows a top view of a semiconductor system according to an aspect of the present disclosure.

For the sake of brevity, duplicate descriptions of features and properties are omitted. It will be understood that the descriptions of any feature and/or property relating to FIG. 1 that are the same or similar to a feature and/or property in FIG. 3 will have those descriptions be applicable here as well.

In an aspect of the present disclosure, a semiconductor system 300 may include a first semiconductor package 302, a motherboard 304, electronic components 350, and a second semiconductor package 332. The electronic components 350 may be disposed on the motherboard 304. The electronic components 350 may be electrically connected to the first semiconductor package 302, and the second semiconductor package 332. The electronic components 350 may be used for various purposes such as power delivery or signal integrity enhancement purposes.

In an aspect, the first semiconductor package 302 may include a first semiconductor device 308, a first package substrate 310, a first integrated heat spreader 314, a first package connector 320A, and a first additional package connector 320B. In an aspect, the first package connector 320A may be configured for electrical connection to a second package connector 340A of the second semiconductor package 332. In another aspect, the first additional package connector 320B may be configured for electrical connection to a second additional package connector 340B of the second semiconductor package 332.

In an aspect of the present disclosure, the first package connector 320A, and the second package connector 340A may have either receptacles or plugs. In an aspect, the first package connector 320A, and the second package connector 340A may be a receptacle-plug pair. In other words, if the first package connector 320A is a receptacle, the second package connector 340A is a plug, and if the first package connector 320A is a plug, the second package connector 340A is a receptacle. An electrical connection between the first package connector 320A, and the second package connector 340A may be established when a plug is inserted into a receptacle.

Alternatively, a cable 330A may be used to electrically connect the first package connector 320A, and the second package connector 340A. A first end of the cable 330A e.g., a first cable plug may be inserted into the first package connector 320A, and a second end of the cable 330A e.g., a second cable plug, may be inserted into the second package connector 340A.

For the sake of brevity, duplicate descriptions of features and properties are omitted. It will be understood that the descriptions of any description and/or feature and/or property relating to the first package connector 320A, and the second package connector 340A will apply to the first additional package connector 320B, and the second additional package connector 340B.

In an aspect of the present disclosure, the first package connector 320A and the first additional package connector 320B may be configured for different purposes. In an aspect, the first package connector 320A may be configured to transmit low-speed signals, and the first additional package connector 320B may be configured to transmit high-speed signals. In another aspect, the first package connector 320A may be configured to transmit high-speed signals, and the first additional package connector 320B may be configured to transmit low-speed signals. High-speed signals may be signals at a signal frequency of more than 40 GHz.

In an aspect of the present disclosure, the first cable 330A may include a first dielectric material having a first dielectric properties e.g., a first dielectric loss tangent and/or a first dielectric constant. In an aspect, the second cable 330B may include a second dielectric material having a second dielectric properties e.g., a second dielectric loss tangent and/or a second dielectric constant different from the first dielectric material. In an aspect, a cable 330 which may be configured to transmit high-speed signals may include a lower dielectric constant ranging approximately between 2.0 to 3.0, and a lower dielectric loss tangent ranging approximately between 0.001 to 0.005 compared to another cable 330 which may be configured to transmit low-speed signals with a higher dielectric constant ranging approximately between 3.0 to 4.5, and a higher dielectric loss tangent ranging approximately between 0.006 to 0.03.

In another aspect, the first package connector 320A may be configured to transmit signals, and the first additional package connector 320B may be configured to transmit power. In another aspect, the first package connector 320A may be configured to transmit power, and the first additional package connector 320B may be configured to transmit signals.

In an aspect, the number of package connectors for each semiconductor package may be any suitable integer n. In an aspect, the number of suitable integer n may be chosen based on the size of the package connectors as well as the size of the integrated heat spreader. In an aspect, the number of suitable integer n may be chosen based on the number of different types of signals and/or the number of different power/voltages to be sent from one semiconductor package to another semiconductor package. It will be understood that the descriptions of any description and/or feature and/or property relating to the first package connector 320A, and the second package connector 340A will apply to each of n package connectors.

Figure 4A:
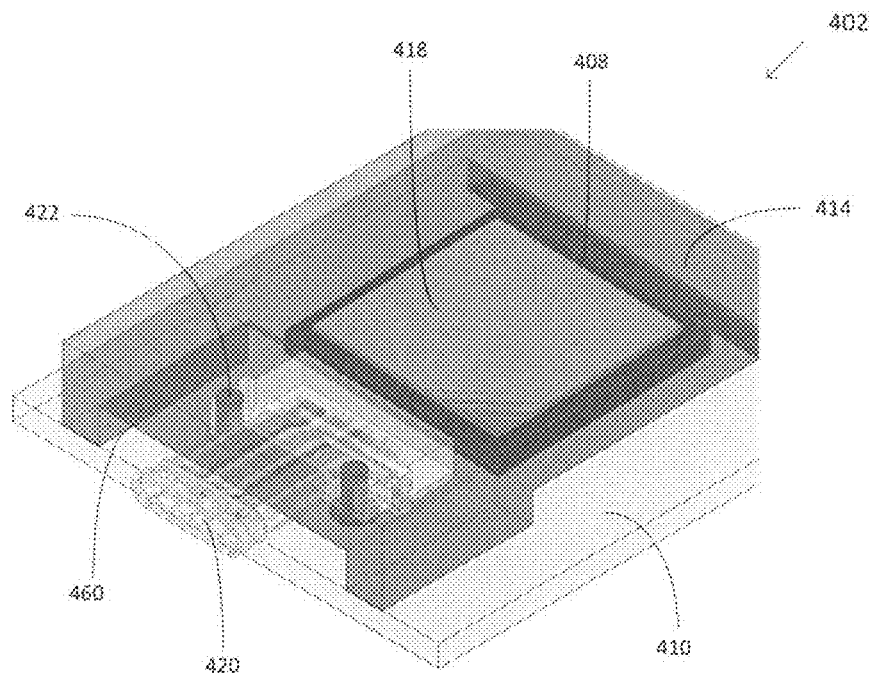
FIG. 4A shows a perspective view of a semiconductor package with a package connector mounted on an integrated heat spreader according to an aspect of the present disclosure.
Figure 4B:
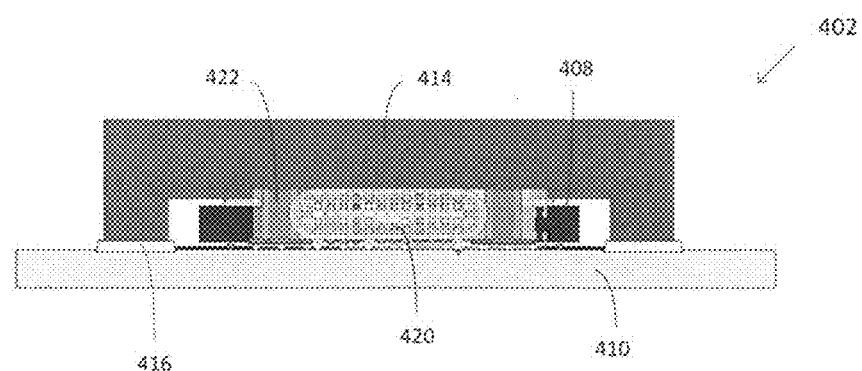
FIG. 4B shows a side view of a semiconductor package of FIG. 4A according to an aspect of the present disclosure.

FIG. 4A shows a perspective view of a semiconductor package with a package connector mounted on an integrated heat spreader according to an aspect of the present disclosure. FIG. 4B shows a side view of a semiconductor package of FIG. 4A according to an aspect of the present disclosure.

For the sake of brevity, duplicate descriptions of features and properties are omitted. It will be understood that the descriptions of any feature and/or property relating to FIGS. 1 and 3 that are the same or similar to a feature and/or property in FIGS. 4A and 4B will have those descriptions be applicable here as well.

As shown in FIGS. 4A and 4B, a semiconductor package 402 may include a semiconductor device 408. The semiconductor package 402 may also include a package substrate 410. In an aspect, the semiconductor package 402 may include an integrated heat spreader 414. The integrated heat spreader 414 may be connected to the package substrate 410 through adhesive layer 416. The adhesive layer 416 may also provide an electrical connection between the integrated heat spreader 414, and the package substrate 410. In an aspect, the semiconductor package 402 may include a thermal interface layer 418. The thermal interface layer 418 may be between the semiconductor device 408, and the integrated heat spreader 414.

In an aspect of the present disclosure, the semiconductor package 402 may include a package connector 420. The package connector 420 may be arranged to be mounted on the integrated heat spreader 414. The package connector 420 may be mounted to the integrated heat spreader 414 using any suitable connection means such as one or more mounting screws 422. In an aspect, the integrated heat spreader 414 may have a recess 460 on an inner surface of the integrated heat spreader 414 in a portion of the integrated heat spreader 414 positioned to cover the package connector 420. The package connector 420 may be arranged to be mounted on the recessed inner surface of the integrated heat spreader 414. In an aspect, a first portion of the integrated heat spreader 414 positioned to cover the semiconductor device 408 may be thicker than a second portion of the integrated heat spreader 414 positioned to cover the package connector 420 due to the recess 460. In an aspect, the package connector 420 may be thicker than the semiconductor device 408. The recess 460 in the second portion of the integrated heat spreader 414 positioned to cover the package connector 420 may result in additional space in the second portion of the integrated heat spreader 414, which may allow the package connector 420 to fit between the integrated heat spreader 414 and the package substrate 410.

Figure 5A:
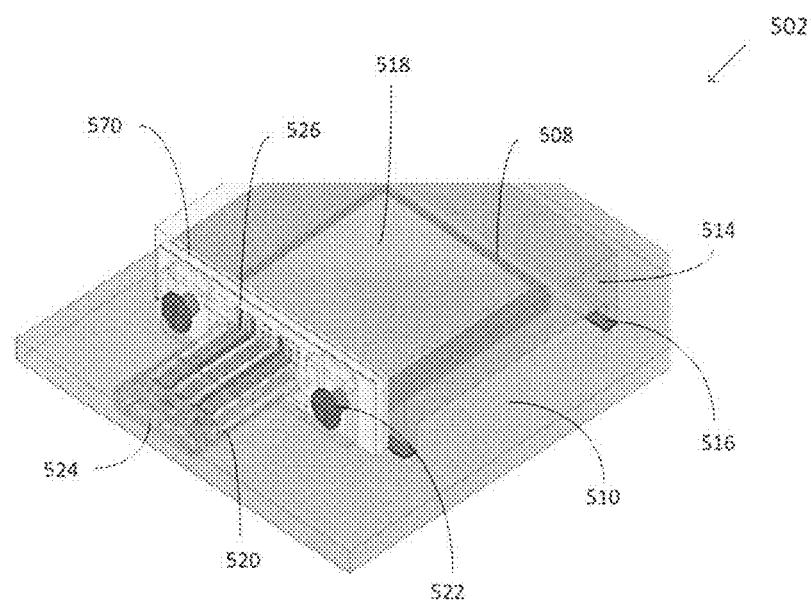
FIG. 5A shows a perspective view of a semiconductor package with a package connector mounted on a side of an integrated heat spreader according to an aspect of the present disclosure.
Figure 5B:
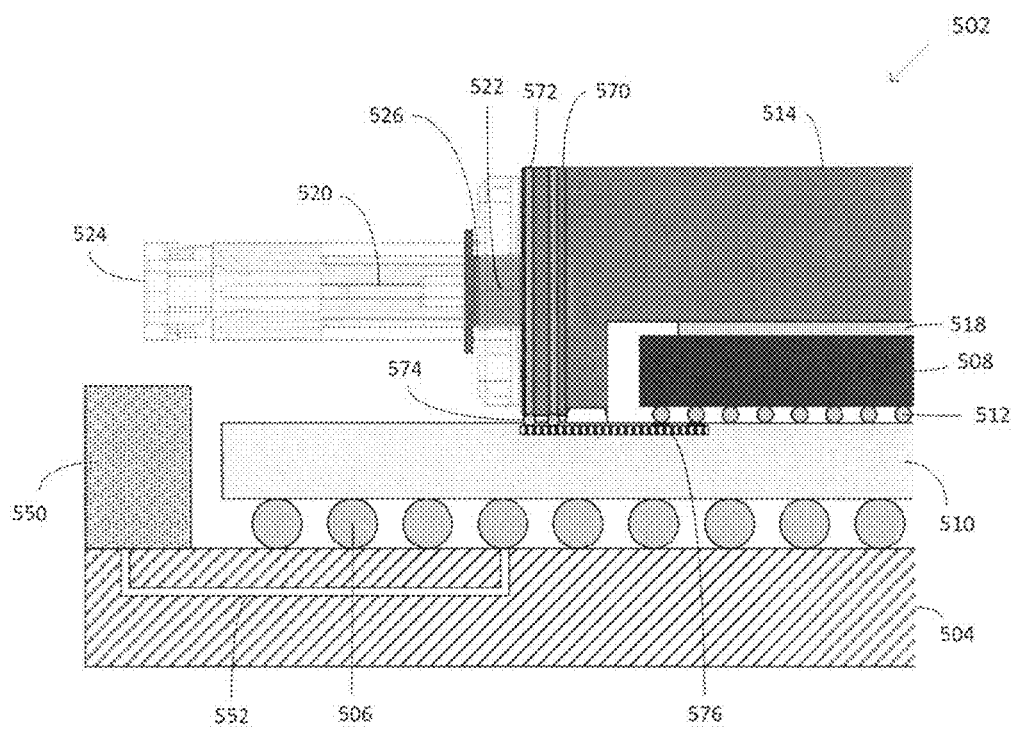
FIG. 5B shows a cross-sectional view of the semiconductor package of FIG. 5A according to an aspect of the present disclosure.

FIG. 5A shows a perspective view of a semiconductor package with a package connector mounted on a side of an integrated heat spreader according to an aspect of the present disclosure. FIG. 5B shows a cross-sectional view of the semiconductor package of FIG. 5A according to an aspect of the present disclosure.

For the sake of brevity, duplicate descriptions of features and properties are omitted. It will be understood that the descriptions of any feature and/or property relating to FIGS. 1, 3, 4A, and 4B that are the same or similar to a feature and/or property in FIGS. 5A and 5B will have those descriptions be applicable here as well.

As shown in FIGS. 5A and 5B, a semiconductor package 502 may include a semiconductor device 508. The semiconductor package 502 may also include a package substrate 510. In an aspect, the semiconductor package 502 may include an integrated heat spreader 514. The integrated heat spreader 514 may be connected to the package substrate 510 through adhesive layer 516. The adhesive layer 516 may also provide an electrical connection between the integrated heat spreader 514, and the package substrate 510. In an aspect, the semiconductor package 502 may include a thermal interface layer 518. The thermal interface layer 518 may be between the semiconductor device 508, and the integrated heat spreader 514.

In an aspect, the package substrate 510 may be connected to a motherboard 504 through solder balls 506. The solder balls 506 may also provide an electrical connection between the package substrate 510, and the motherboard 504. The solder balls 506 may also provide an electrical connection between the package substrate 510, and an electronic component 550 through electrical routing 552.

In an aspect of the present disclosure, the semiconductor package 502 may include a package connector 520. The package connector 520 may be arranged to be mounted on the integrated heat spreader 514. The package connector 520 may be mounted to the integrated heat spreader 514 using any suitable connection means such as one or more mounting screws 522. In an aspect, the package connector 520 may be arranged to be mounted on a side surface of the integrated heat spreader 514.

In an aspect of the present disclosure, the package connector 520 may have a first side 524 which may be configured for electrical connection to a second package connector of a second semiconductor package. In an aspect of the present disclosure, the package connector 520 may have a second side 526 which may be configured for electrical connection to the semiconductor device 508. In an aspect, the semiconductor package 502 may include a sub-PCB 570 which may be attached to the integrated heat spreader. In an aspect, the sub-PCB 570 may be configured to provide an electrical connection between the second side 526 of the package connector 520, and the semiconductor device 508. In an aspect, signals from the package connector 520 pass through board routing 572 of the sub-PCB 570, and flow through the sub-PCB 570 to solder bumps 574 between the sub-PCB 570 and the package substrate 510. The signals then pass through routing 576 of the package substrate 510 to the semiconductor device 508.

EXAMPLES

Example 1 may include a device including a semiconductor device coupled to a package substrate; an integrated heat spreader coupled to the package substrate; and a package connector mounted on the integrated heat spreader.

Example 2 may include the device of example 1 and/or any other example disclosed herein in which the integrated heat spreader includes a recessed inner surface, and the package connector is mounted on the recessed inner surface.

Example 3 may include the device of example 2 and/or any other example disclosed herein in which the package connector includes a first side configured for electrical connection to a second package connector of a second device, and a second side configured with connection pins for electrical connection to the semiconductor device.

Example 4 may include the device of example 2 and/or any other example disclosed herein in which a first portion of the integrated heat spreader positioned to cover the semiconductor device is thicker than a second portion of the integrated heat spreader having the recessed inner surface.

Example 5 may include the device of example 1 and/or any other example disclosed herein in which the package connector is mounted on a side surface of the integrated heat spreader.

Example 6 may include the device of example 6 and/or any other example disclosed herein in which the device includes a printed circuit board attached to the integrated heat spreader; in which the package connector includes a first side configured for electrical connection to a second package connector of a second device, and a second side configured for electrical connection to the printed circuit board; and in which the printed circuit board is configured to provide an electrical connection between the second side of the package connector and the semiconductor device.

Example 7 may include the device of example 3 and/or any other example disclosed herein in which the device includes the package connector having at least one cable to form the electrical connection with the second package connector.

Example 8 may include the device of example 8 and/or any other example disclosed herein in which the package connector is a receptacle and the second package connector is a plug.

Example 9 may include the device of example 1 and/or any other example disclosed herein in which the device further includes an additional package connector, and in which the package connector is configured to transmit low-speed signals and the additional package connector is configured to transmit high-speed signals or a converse configuration.

Example 10 may include the device of example 9 and/or any other example disclosed herein in which high-speed signals have a signal frequency of more than 40 GHz.

Example 11 may include the device of example 1 and/or any other example disclosed herein in which the device further includes an additional package connector, and in which the package connector is configured to transmit signals and the additional package connector is configured to transmit power or a converse configuration.

Example 12 may include a system including a first semiconductor package including a first package connector and a first integrated heat spreader, in which the first package connector is mounted on the first integrated heat spreader; a second semiconductor package including a second package connector, and a second integrated heat spreader, in which the second package connector is mounted on the second integrated heat spreader; and in which the first package connector is electrically connected to the second package connector.

Example 13 may include the system of example 12 and/or any other example disclosed herein in which the system includes a cable for electrically connecting the first package connector to the second package connector.

Example 14 may include the system of example 12 and/or any other example disclosed herein in which the first package connector is a receptacle and the second package connector is a plug.

Example 15 may include a method including forming a package substrate; forming a semiconductor device and coupling the semiconductor device on the package substrate; forming an integrated heat spreader; forming a package connector, and mounting the package connector on the integrated heat spreader; mounting the integrated heat spreader with the package connector over the semiconductor device on the package substrate; in which the package connector has a first side configured for electrical connection to a second package connector of a second semiconductor package, and a second side configured for electrical connection to the semiconductor device.

Example 16 may include the method of example 15 and/or any other example disclosed herein in which forming an integrated heat spreader includes forming a recess on an inner surface of the integrated heat spreader; and in which mounting the package connector on the integrated heat spreader includes mounting the package connector in the recess.

Example 17 may include the method of example 15 and/or any other example disclosed herein in which the method includes forming connection pins on the package connector for providing an electrical connection between the package connector and the semiconductor device.

Example 18 may include the method of example 15 and/or any other example disclosed herein in which a first portion of the integrated heat spreader over the semiconductor device is thicker than a second portion of the integrated heat spreader with the mounted package connector.

Example 19 may include the method of example 15 and/or any other example disclosed herein in which mounting the package connector on the integrated heat spreader includes mounting the package connector on a side surface of the integrated heat spreader.

Example 20 may include the method of example 19 and/or any other example disclosed herein in which the method includes forming a printed circuit board, and mounting the printed circuit board on the side surface of the integrated heat spreader; and coupling the printed circuit board to the package substrate for providing the electrical connection between the package connector, and the semiconductor device.

These and other advantages and features of the aspects herein disclosed will be apparent through reference to the following description and the accompanying drawings. Furthermore, it is to be understood that the features of the various aspects described herein are not mutually exclusive and can exist in various combinations and permutations.

It will be understood that any property described herein for a specific system or package may also hold for any system or package described herein. It will also be understood that any property described herein for a specific method may hold for any of the methods described herein. Furthermore, it will be understood that for any package, system, or method described herein, not necessarily all the components or operations described will be enclosed in the package, system, or method, but only some (but not all) components or operations may be enclosed.

The term "comprising" shall be understood to have a broad meaning similar to the term "including" and will be understood to imply the inclusion of a stated integer or operation or group of integers or operations but not the exclusion of any other integer or operation or group of integers or operations. This definition also applies to variations on the term "comprising" such as "comprise" and "comprises".

The term "coupled" (or "connected") herein may be understood as electrically coupled or as mechanically coupled, e.g., attached or fixed or attached, or just in contact without any fixation, and it will be understood that both direct coupling or indirect coupling (in other words: coupling without direct contact) may be provided.

While the present disclosure has been particularly shown and described with reference to specific aspects, it should be understood by those skilled in the art that various changes in form and detail may be made therein without departing from the spirit and scope of the present disclosure as defined by the appended claims. The scope of the present disclosure is thus indicated by the appended claims and all changes which come within the meaning and range of equivalency of the claims are therefore intended to be embraced.

What is claimed is:

1. A device comprising:
a semiconductor device coupled to a package substrate;
an integrated heat spreader coupled to the package substrate; and
a package connector mounted on the integrated heat spreader;
wherein the integrated heat spreader further comprises a recessed inner surface and the package connector is mounted on the recessed inner surface;
wherein the package connector further comprises a first side configured for electrical connection to a second package connector of a second device and a second side configured with connection pins for electrical connection to the semiconductor device.

2. The device of claim 1, wherein the package connector is mounted on a side surface of the integrated heat spreader.

3. The device of claim 2, wherein the device further comprises a printed circuit board attached to the integrated heat spreader;
wherein the package connector further comprises a first side configured for electrical connection to a second package connector of a second device and a second side configured for electrical connection to the printed circuit board; and
wherein the printed circuit board is configured to provide an electrical connection between the second side of the package connector and the semiconductor device.

4. The device of claim 1, further comprising the package connector having at least one cable to form the electrical connection with the second package connector.

5. The device of claim 1, wherein the package connector is a receptacle and the second package connector is a plug.

6. The device of claim 1, further comprises an additional package connector, wherein the package connector is configured to transmit low-speed signals and the additional package connector is configured to transmit high-speed signals or a converse configuration.

7. The device of claim 6, wherein high-speed signals have a signal frequency of more than 40 GHz.

8. The device of claim 1, further comprises an additional package connector, wherein the package connector is configured to transmit signals and the additional package connector is configured to transmit power or a converse configuration.

9. A device comprising:
a semiconductor device coupled to a package substrate;
an integrated heat spreader coupled to the package substrate; and
a package connector mounted on the integrated heat spreader;
wherein the integrated heat spreader further comprises a recessed inner surface and the package connector is mounted on the recessed inner surface; and
wherein a first portion of the integrated heat spreader positioned to cover the semiconductor device is thicker than a second portion of the integrated heat spreader having the recessed inner surface.

10. The device of claim 9, wherein the package connector further comprises a first side configured for electrical connection to a second package connector of a second device and a second side configured with connection pins for electrical connection to the semiconductor device.

11. The device of claim 10, further comprising the package connector having at least one cable to form the electrical connection with the second package connector.

12. The device of claim 10, wherein the package connector is a receptacle and the second package connector is a plug.

13. The device of claim 9, wherein the package connector is mounted on a side surface of the integrated heat spreader.

14. The device of claim 13, wherein the device further comprises a printed circuit board attached to the integrated heat spreader;
wherein the package connector further comprises a first side configured for electrical connection to a second package connector of a second device and a second side configured for electrical connection to the printed circuit board; and
wherein the printed circuit board is configured to provide an electrical connection between the second side of the package connector and the semiconductor device.

15. The device of claim 9, further comprises an additional package connector, wherein the package connector is configured to transmit low-speed signals and the additional package connector is configured to transmit high-speed signals or a converse configuration.

16. The device of claim 15, wherein high-speed signals have a signal frequency of more than 40 GHz.

17. The device of claim 9, further comprises an additional package connector, wherein the package connector is configured to transmit signals and the additional package connector is configured to transmit power or a converse configuration.

18. A device comprising:
   a semiconductor device coupled to a package substrate;
   an integrated heat spreader coupled to the package substrate; and
   a package connector mounted on the integrated heat spreader;
   further comprising an additional package connector, wherein the package connector is configured to transmit signals and the additional package connector is configured to transmit power or a converse configuration.

* * * * *